United States Patent [19]

Gay

[11] 4,311,873
[45] Jan. 19, 1982

[54] BIAS CONTROL CIRCUIT AND METHOD FOR USE IN AUDIO REPRODUCTION SYSTEM OR THE LIKE

[75] Inventor: Michael J. Gay, Geneva, Switzerland

[73] Assignee: Motorola, Inc., Schaumburg, Ill.

[21] Appl. No.: 128,999

[22] Filed: Mar. 10, 1980

[51] Int. Cl.³ .............................................. H03G 5/16
[52] U.S. Cl. .................................. 179/1 D; 179/1 VL
[58] Field of Search .................. 179/1 D, 1 VL, 1 P; 333/28 R, 28 T; 330/254, 284

[56] References Cited

U.S. PATENT DOCUMENTS

| 3,849,601 | 11/1974 | Goncharoff | 179/1 D |
| 4,055,818 | 10/1977 | Gay | 333/28 T |

Primary Examiner—Bernard Konick
Assistant Examiner—J. A. Popek
Attorney, Agent, or Firm—Michael D. Bingham

[57] ABSTRACT

A bias control circuit adapted to be utilized with complementary, tracking current sources for use in an audio reproduction system including volume and tone control circuits to optimize the signal to noise ratio of the system at maximum gain without compromising the signal handling capabilities of the system. The bias control circuit includes an interface circuit responsive to an applied volume control signal for varying a bias signal connected to the output of the interface circuit. A second and third circuit are coupled with the output of the interface circuit which are responsive to the bias signal for deriving, respectively, a volume output signal to control the gain of the volume control circuit and a current biasing signal for controlling the bias levels of the tone control circuits. The current biasing signal varys proportionally with increases in the volume control signal from a first level to a second level remaining constant thereafter. The current biasing signal is utilized to control the magnitude of the complementary, tracking current sources.

15 Claims, 4 Drawing Figures

BIAS CONTROL CIRCUIT AND METHOD FOR USE IN AUDIO REPRODUCTION SYSTEM OR THE LIKE

BACKGROUND OF THE INVENTION

This invention relates to volume and tone control circuits typically found in high fidelity sound reproduction systems and more particularly to a system for providing bias control signals to the volume and tone control circuits while substantially reducing noise produced by the control circuits.

Most, if not all, analog direct current controlled tone and volume control circuits use differentially connected transistor pairs as variable signal splitting circuits. For example, typical treble and bass tone control circuits are disclosed in U.S. Pat. No. 4,055,818, Michael J. Gay, which is assigned to Motorola, Inc. The amount of signal splitting between respective outputs of the transistor pairs is controlled by the direct current bias voltage supplied at the control terminals thereof.

A problem occurs with this arrangement by the generation of partition noise, i.e., the random variations in the division of the currents between the outputs of the two transistors of the transistor pair. From analysis, it has been determined that these noise sources have components which increase in amplitude as the bias current through the transistor pairs is increased. Since the bias current must be sufficient to carry the maximun input signal current supplied to the sound reproduction system, it is evident that the higher the input signal is, the higher the bias current must be and, hence, the higher the noise will be.

An audio sound system must normally accept input signals over a wide dynamic range. Under this condition the signal splitting volume and tone control circuits must be biased to carry the maximum signal levels and will therefore generate noise correspondingly.

Therefore, a need exists to provide circuitry and method for minimizing the noise produced in volume and tone control circuits of a high fidelity sound system which is generated by the magnitude of bias splitting currents produced therein.

SUMMARY OF THE INVENTION

Accordingly, it is an object of the present invention to provide circuitry and a method for use in a system having volume control for reducing system noise as volume is varied.

It is another object of the present invention to provide bias control signals to operate volume and tone control circuits in a sound reproduction system while improving the signal to noise level at maximum gain of the system.

A further object of the invention is to provide circuitry suitable for fabrication in monolithic integrated circuit form for controlling volume and tone in a sound reproduction system and minimizing noise produced in said system.

Still further, it is an object of the invention to provide a circuit that is responsive to a volume control voltage for producing bias tracking output signals to vary the output of volume and tone control circuits in an audio sound system while obtaining maximum signal to noise level at maximum system gain.

In accordance with the foregoing and other objects there is provided circuitry for use in an audio sound system having both volume and tone control circuits which is responsive to a volume control signal for varying the bias levels of the control circuits accordingly to improve the signal to noise level of the system at maximum gain.

In the preferred embodiment of the invention the bias control circuit comprises a first transistor which receives the volume control signal at a control terminal thereof; a second transistor having a control terminal thereof coupled with the two main electrodes of the first transistor, a control voltage is produced across a load resistor of the second transistor which varies inversely with the control voltage. The control electrode of the second transistor is coupled to the control electrode of a third transistor connected as an emitter-follower to the control electrode of a fourth transistor. The main current path of the fourth transistor is coupled to the control electrodes of a fifth and sixth transistor and to the emitter electrode of a seventh transistor, respectively. The collector of the fifth transistor is coupled to the collector and control electrode of the sixth and seventh transistors respectively with the collector of the seventh transistor being coupled to a terminal which is adapted to receive a source of operating potential. The emitter of the sixth transistor is coupled to a reference supply conductor. A bias control voltage is developed at the control electrode of the sixth transistor that is proportional to said volume control voltage.

A feature of the invention is that the control voltage produced at the output of the second transistor may be utilized to drive a volume control circuit that consists of a transistor pair while the bias control voltage is utilized to vary the bias current levels in tone control circuits of the sound system whereby a maximum signal to noise ratio is produced in the sound system at the maximum gain operating condition.

Another feature of the invention comprises controlling the bias currents of the tone control circuits through the arrangement of complementary current sources.

DETAILED DESCRIPTION OF THE PREFERRED EMBODIMENT

General Introduction

Figure 1:
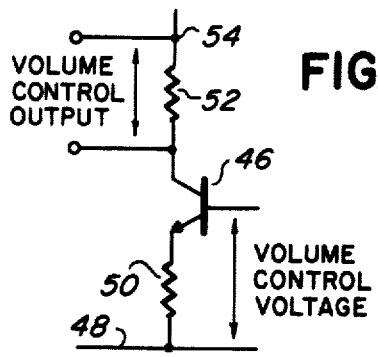
FIG. 1 is a schematic diagram of a transistor pair utilized as a signal splitting circuit.

Turning to FIG. 1 there is shown a typical transistor pair circuit used in sound systems to control volume and tone. The transistor pair comprises transistors 10 and 12 having their emitters differentially connected to a common node 14. A bias or splitter direct current (d.c.) control voltage is applied to the base inputs to control the amount of current split or division in the collectors. As shown a bias current source produces a total bias current (i) from common node 14 which is shared by the collectors of transistors 10 and 12 in the ratio 1/1-a.

As has been aforementioned above, because the audio system must accept input signals over a wide dynamic range the transistor pair circuits are normally biased to handle the maximum signal levels which may be received. This biasing scheme generates undesirous noise levels in the system. It may be assumed that in a sound system having a volume control stage responsive to a volume control input voltage the gain thereof will be adjusted inversely to the input signal level to maintain a constant output level. The present invention has recognized that the foregoing system requirement can be utilized to adjust the bias currents in the transistor pair control circuits in accordance with the volume control level to maintain a minimum bias current level necessary at all times to minimize the current partition noise.

Application

In a typical sound system the treble and bass tone control circuits preceed the volume control circuit so that the noise in the former circuit is reduced when the volume level is reduced. The treble and bass control stages must therefore have sufficient bias currents to be maintained at a bias level to handle the maximum input signal level without causing overloading at the output of the system. Typically, the sound system specification might require that 100 mv rms input levels produce full output but that the system be able to receive up to 1 v rms. It is evident that if the sound system is set at full gain it need only receive an input signal of 100 mv rms since any higher input level will cause overloading in the following amplifier stages. Thus, if the maximum input of 1 v rms is applied, the gain of the sound receiver system must be reduced by 20 dB to maintain a proper output level. Simultaneously, the stages preceeding the volume control stage must be adapted to handle the higher signal level. In the present invention it is provided to adapt these signal splitting tone control stages to receive the higher input signal by increasing the bias currents there through by approximately ten (10) times over the bias level at the lower signal input. Thus, where the system is set to full gain the tone control circuits will be biased at a current level sufficient to handle the 100 mv rms input signal thereby maintaining an optimum signal to noise ratio, and as the gain is reduced the tone control circuits current bias levels will be increased (to a maximum of 10 times) to handle the maximum input signals without overloading the output.

Practical Realization of the Invention

The bias control circuit of the present invention is suitable for realization in integrated circuit (IC) form. In an IC that normally has direct coupled interstages it is not usually possible to vary any one of the bias current levels of the current splitter control circuits without affecting others. Thus, the invention to be described herein is to be generally utilized in conjunction with the novel complementary current source shown in FIG. 2. PNP current sources comprising transistors 16, and 18 are intended to provide collector current in order to source current to respective tone or volume control circuits utilizing transistor pairs as shown in FIG. 1. Transistors 16 and 18 have base electrodes interconnected with each other to node 20. The emitter electrodes of transistors 16 and 18 are returned to terminal 22 via power supply conductor 24 to a source of operating potential +v through respective emitter resistors Re. A bias dropping diode 26 is connected between terminals 20 and 22 in series with resistor 26' to bias the bases of these two transistor at a voltage level one diode drop plus the voltage appearing across resistor 26' below +v. Thus, the current through transistors 16 and 18 is defined by the voltage drop across resistor 26'. NPN current source transistors 28-32 likewise have their base electrodes connected in common with the base electrode of NPN transistors 34 to terminal 37 at which is supplied a bias control voltage for varying the collector currents in each of the NPN and PNP current source transistors. Respective collectors of the NPN transistors 28-32 would be utilized to source current through the individual emitter-collector paths from splitter control circuits coupled therewith. The emitters of transistors 28-34 are coupled through respective emitter resistors 36-42 to power supply conductor 44. Power supply conductor 44 is adapted to receive a reference bias potential which may be either at ground reference or at a negative voltage level ($-v$). Transistor 34 is shown with the collector-emitter path thereof connected in series with diode 26. In general, both NPN and PNP sources are utilized in the configuration shown with biasing of the PNP transistors being established through NPN transistor 34 to ensure tracking of the current source. It should be apparent that the bias control circuit of the invention to be described hereinafter may be utilized with other current source configurations and is not to be unnecessarily limited to the current source circuitry described above and shown in FIG. 2.

Figure 3:
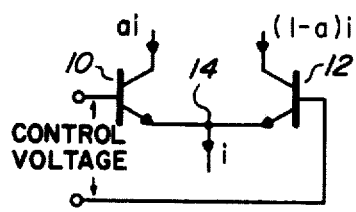
FIG. 3 is a schematic diagram of a volume control interface circuit of the preferred embodiment of the present invention.
Figure 2:
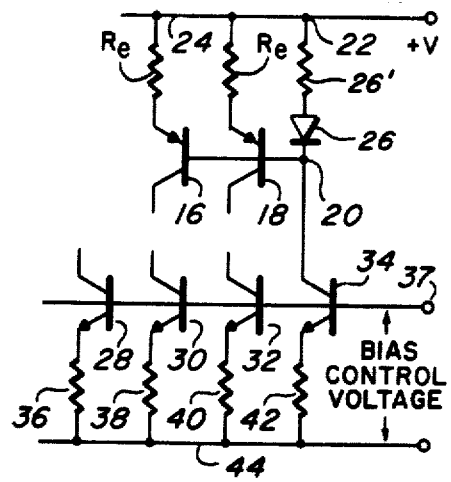
FIG. 2 is a schematic diagram of an interface circuit including complementary current sources of the present invention.

It is assumed that the bias control voltage developed by the present invention to bias the aforementioned control circuits via the complementary current source of FIG. 2 will be derived from the volume control voltage generally provided in audio reproduction systems. Typically, this volume control voltage varies from 0–5 volts, as is understood. Since a signal splitting pair (FIG. 1) provides an attenuation of approximately 20 dB per 60 mv at ambient temperature the volume control voltage must be reduced to approximately 300 mv maximum when applied to a transistor pair control circuit. A voltage interface circuit for realizing this reduction is shown in FIG. 3 comprising transistor 46. The base of transistor 46 is adapted to receive the volume control voltage coupled thereto. The emitter of this transistor is coupled to a power supply conductor 48 via resistor 50. The reduced volume control voltage supplied to a signal splitter transistor pair is derived across resistor 52 which is coupled between terminal 54 (at which is provided a suitable bias voltage) and the collector of transistor 46.

Figure 4:
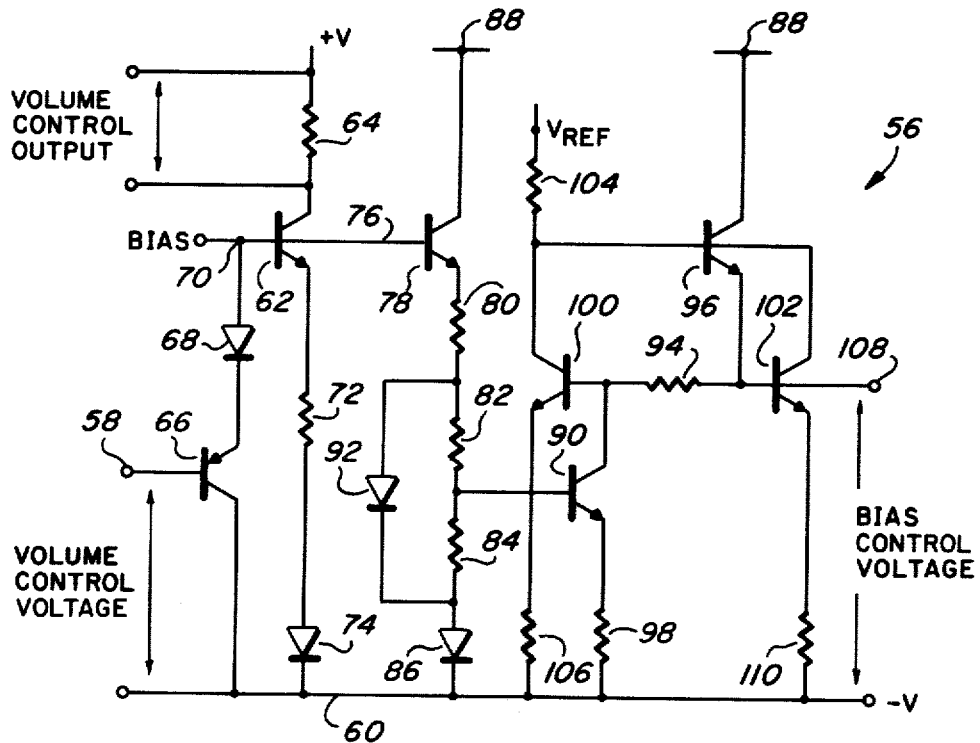
FIG. 4 is a schematic diagram of a practical bias control circuit of the preferred embodiment of the present invention.

Turning now to FIG. 4 there is shown bias control circuit 56 of the invention which provides both a reduced volume control signal and a bias control voltage useful for varying the bias of volume and tone control circuits in an audio system.

In an audio reproduction system utilizing the bias control circuit of FIG. 4 it is necessary to develop a bias control voltage from the applied volume control voltage in such a manner that, for example, with high level input signals the voltage developed across resistor 52 (FIG. 3) increases by 60 mv and the bias currents in the tone control stages are increased by ten (10) times over the bias current levels at low input signal levels. Bias control circuit 56 provides this necessary performance.

In response to a volume control input voltage supplied between input terminal 58 and supply conductor 60 (which may be at ground reference or negative supply voltage) transistor 62 is rendered conductive accordingly which generates the volume control splitter signal across resistor 64. Resistor 64 is coupled between a bias potential, +v, and the collector of transistor 62. Transistor 66 having its base coupled to input terminal 58 and its collector coupled to supply conductor 60 has its emitter connected to diode 68. Diode 68 and transistor 66 are biased at some appropriate current level by the bias supplied at node 70 to provide an interface between the input volume control voltage and the base of transistor 62. The emitter of transistor 62 is coupled through resistor 72 and diode 74 to power supply conductor 60.

The action of bias control circuit 56 is such that increasing the volume control voltage to terminal 58 reduces the system gain (this is simply a matter of phasing the connections of resistor 64 between the volume control circuit signal splitter transistor pair. Hence, increasing the voltage at terminal 58 renders transistor 66 less conductive which in turn renders transistor 62 more conductive. This causes the magnitude of voltage developed across resistor 64 to increase with increase in the primary volume control voltage at terminal 58; though at a reduced level.

Transistor 78 connected in an emitter follower configuration through resistors 80,82,84 and diode 86 to power supply conductor 60 has its base coupled to bias terminal 70 and its collector connected to an operating potential at node 88. The output from transistor 78 is taken at the junction between resistors 82 and 84 and is coupled to the base of transistor 90. A current then flows in transistor 78 which is proportional to the current flow in transistor 62 (assuming that this proportional current flow is insufficient to bias diode 92, which is connected across resistors 82 and 84, into conduction).

A current mirror formed by the connections of resistor 84, diode 86 and transistor 90 sources a current through resistor 94 which is connected between the collector and emitter of transistors 90 and 96 respectively. This current flow through resistor 94 is proportional to the current in transistor 78 (and hence to that in transistor 62) assuming diode 92 is nonconducting. The emitter of transistor 90 is coupled through resistor 98 to the power supply conductor 60.

The collector of transistor 90 is also connected to the bases of transistors 100 and 102. Transistor 100 has its collector directly coupled to the base of transistor 96 and through resistor 104 to a source of reference potential $V_{REF}$. The emitter of transistor 100 is connected through resistor 106 to power suppy conductor 60. The collector of transistor 96 is returned to a source of potential at node 88. An output of bias control circuit 56 is taken at terminal 108 at which is provided a bias control voltage for biasing the tone control circuits of the audio reproduction system. For example, terminal 108 may be connected to the base of transistor 34 (FIG. 2). The collector of transistor 102 is returned to $V_{REF}$ through resistor 104 and the emitter thereof is returned to power supply conductor 60 through resistor 110.

If the volume control voltage supplied at terminal 58 is at zero volts, so that no current flows through transistors 62, 78 and 90, a bias control voltage appears at terminal 108 which is derived by the current flowing from $V_{REF}$ through resistor 104 divided between transistor 100 and transistor 102. The circuit values are such that most of the current passes through transistor 102 and resistor 110 developing a relatively low bias control voltage at terminal 108.

When the volume control voltage is increased at terminal 58 and the gain of the volume control stage connected to resistor 64 is reduced as previously described, the current flowing through transistor 62 which produces a proportional current through transistor 90 causes the voltage at terminal 108 to rise from the first level (described above) due to the feedback action around the circuit loop comprising transistors 96 and 100. The bias control voltage will rise monotonically to a second level with the currents through transistors 62, 78 and 90 until transistor 102 is absorbing all of the current available via resistor 104 and transistor 100 becomes nonconductive. The bias control voltage will remain constant at this second level regardless of further increases in currents through transistors 62, 78 and 90. Diode 92 limits the maximum base voltage applied to transistors 90 so that transistors 100 cannot be again rendered conductive (transistor 90 being driven into saturation).

As disclosed, the gain of the volume control circuit reduces exponentially (linearly in decibels) with the increase of current through transistor 62. The bias currents produced via the bias control voltage generated at terminal 108 increase monotonically up to the chosen limit of the bias control voltage.

Thus what has been described is a system for optimizing the signal to noise ratio of sound systems utilizing current splitting transistors to control the volume and tone of the system. The system increases the biasing currents of the splitter transistor pairs as the overall gain of the sound system is reduced by the combination of a bias control circuit and complementary current sources. The aforedescribed system therefore permits optimization of the current level in the transistor pair circuits for reducing noise at maximum gain of the sound system and for optimizing signal handling as the gain is reduced.

I claim:

1. In a system having combined volume and tone control stages, the stages including bias current splitter transistor pairs, the improvement comprising a bias control circuit responsive to an applied control signal for providing a first control output signal at a first output which is proportional to said applied control signal and providing a second control output signal at a second output which monotonically increases from a first level to a second predetermined level as the applied control signal varies from a minimum to a maximum input level such that the bias current levels in the tone control stages are varied accordingly with said second control output signal to improve the signal to noise ratio of the system.

2. The system of claim 1 wherein said bias control circuit includes:

first circuit means having an input and a pair of output terminals at which is provided said first control output signal, said first circuit means being responsive to a bias signal provided at said input for producing said first control output signal the magnitude of which varies proportionally with the magnitude of said bias signal;

second circuit means having an input adapted to receive said applied control signal and an output coupled to said input of said first circuit means, said second circuit means causing said bias signal supplied to said first circuit means to vary proportionally with the magnitude of said applied control signal; and third circuit means having an input coupled with said input of said first circuit means and an output adapted to be connected to said second output of the bias control circuit for providing said second control output signal in response to said bias signal.

3. The system of claim 2 wherein said first circuit means includes:
- first electron control means having first, second and control electrodes, said control electrode being coupled to said input of said first circuit means, said first electrode being coupled to a first terminal which is adapted to receive a first reference potential thereat; and
- first resistive means coupled between said second electrode of said first electron control means and a second terminal which is adapted to receive a first bias potential, said pair of output terminals being provided across said first resistive means.

4. The system of claim 3 wherein said second circuit means includes a second electron control means having first, second and control electrodes, said first electrode being coupled to said output of said second circuit means, said second electrode being coupled to said first terminal, said control electrode being coupled to said input of said second circuit means.

5. The system of claim 3 or 4 wherein said third circuit means includes:
- third electron control means having first, second and control electrodes, said second electrode being coupled to a terminal which is adapted to receive a second bias potential; said control electrode being coupled to said input of said third circuit means;
- second resistive means coupled between said first electrode of said third electron control means and said first terminal and having an output;
- fourth electron control means having first, second and control electrodes, said control electrode being coupled to said output of said second resistive means, said first electrode being coupled to said first terminal;
- third resistive means coupled between said second electrode of said fourth electron control means and said output of said third circuit means;
- fifth electron control means having first, second and control electrodes, said first electrode being coupled to said first terminal, said second electrode being coupled to a terminal at which is supplied a reference voltage, said control electrode being coupled to said output of said third circuit means; and
- feedback circuit means coupled across said third resistive means to said reference voltage for limiting said second control output signal to said second predetermined level in response to said varying control signal being supplied to said bias control circuit.

6. The system of claim 5 wherein said feedback circuit means includes:
- sixth electron control means having first, second and control electrodes, said first electrode being coupled to said first terminal, said second electrode being coupled to said reference voltage, said control electrode being coupled to said second electrode of said fourth electron control means; and
- seventh electron control means having first, second and control electrodes, said first electrode being coupled to said output of said third circuit means, said second electrode being coupled to said terminal adpated to receive said second bias potential and said control electrode being coupled to said reference voltage.

7. In an audio system having volume and tone control stages the tone control stages having transistor pair circuits for splitting bias currents therethrough, the improvement comprising:
- bias circuit means including a plurality of variable, tracking current sources adapted to receive a first bias control signal for varying the bias current levels through the tone control stages and the volume control stage; and
- bias control circuit means adapted to receive a volume control input signal for producing a control output signal at a first output and for producing said first bias control signal at a second output, said first bias control signal increasing from a first predetermined level to a second predetermined level as said volume control input signal varies from a minimum to a maximum value, the magnitude of said control input signal varying linearly with said volume control input signal and being proportional thereto.

8. The audio system of claim 7 wherein said bias circuit means includes:
- a plurality of electron control means of a first conductivity type each having first, second and control electrodes, said control electrodes being interconnected at a first common node which is adapted to receive a second bias control signal generated from said first bias control signal, said first electrodes being coupled in parallel to a first power supply conductor, said second electrodes providing a first set of bias currents thereat; and
- a plurality of electron control means of a second conductivity type each having first, second and control electrodes, said control electrodes of each of said electron control means being interconnected to a second common node at which is supplied said first bias control signal, said first electrodes being coupled in parallel to a second power supply conductor, at least one of said electron control means of said second conductivity type having said second electrode coupled to said first common node, said second electrodes of the other of said plurality of electron control means providing a second set of bias currents thereat, the level of said first and second sets of currents being varied in response to said first bias control signal.

9. The audio system of claim 8 including:
- said electron control means of a first conductivity type being PNP transistors;
- said electron control means of a second conductivity type being NPN transistors; and
- a first diode being coupled between said first power supply conductor and said first common node.

10. The audio system of claim 7 or 8 wherein said bias control circuit means includes:
- first circuit means having an input and a pair of output terminals at which is provided said first control output signal, said first circuit means being responsive to a bias signal provided at said input for producing said first control output signal the magnitude of which varies proportionally with the magnitude of said bias signal;
- interface circuit means having an input adapted to receive said volume control input signal and an output coupled to said input of said first circuit means, said interface circuit causing said bias signal supplied to said first circuit means to vary proportionally with the magnitude of said volume control input signal; and second circuit means having an input coupled to said input of said first circuit means and an output adapted to be connected to said second output of the bias control circuit means for providing said first bias control signal in response to said bias signal supplied at the input thereof being varied.

11. The audio system of claim 10 wherein said first circuit means includes:
   first electron control means having first, second and control electrodes, said control electrode being coupled to said input of said first circuit means, said first electrode being coupled to a first terminal which is adapted to receive a first reference potential thereat; and
   first resistive means coupled between said second electrode of said first electron control means and a second terminal which is adapted to receive a first bias potential, said pair of output terminals being provided across said first resistive means.

12. The audio system of claim 11 wherein said interface circuit means includes a second electron control means having first, second and control electrodes, said first electrode being coupled to said output of said interface circuit means, said second electrode being coupled to said first terminal, said control electrode being coupled to said input of said interface circuit means.

13. The audio system of claim 12 wherein said second circuit means includes:
   third electron control means having first, second and control electrodes, said second electrode being coupled to a terminal which is adapted to receive a second bias potential; said control electrode being coupled to said input of said second circuit means;
   second resistive means coupled between said first electrode of said third electron control means and said first terminal and having an output;
   fourth electron control means having first, second and control electrodes, said control electrode being coupled to said output of said second resistive means, said first electrode being coupled to said first terminal;
   third resistive means coupled between said second electrode of said fourth electron control means and said output of said second circuit means;
   fifth electron control means having first, second and control electrodes, said first electrode being coupled to said first terminal, said second electrode being coupled to a terminal at which is supplied a reference voltage, said control electrode being coupled to said output of said second circuit means; and
   feedback circuit means coupled across said third resistive means to said reference voltage for limiting said second control output signal to said second predetermined level in response to said varying control signal being supplied to said bias control circuit.

14. The audio system of claim 13 wherein said feedback circuit means includes:
   sixth electron control means having first, second and control electrodes, said first electrode being coupled to said first terminal, said second electrode being coupled to said reference voltage, said control electrode being coupled to said second electrode of said fourth electron control means; and
   seventh electron control means having first, second and control electrodes, said first electrode being coupled to said output of said second circuit means, said second electrode being coupled to said terminal adapted to receive said second bias potential and said control electrode being coupled to said reference voltage.

15. A method for optimizing the signal to noise ratio of an audio reproduction system, comprising the steps of:
   deriving a volume control signal for varying the gain of the system;
   deriving a biasing signal in response to said volume control signal; said biasing signal increasing monotonically from a first level to a second level as said volume control signal is varied to vary the gain of the system;
   providing a current source having a plurality of tracking current sources the magnitude of current produced therefrom being controlled by said biasing signal; and
   providing a plurality of tone control circuits and a volume control circuit coupled with said current sources respectively such that the current bias levels thereof are varied in accordance with the current magnitude from said tracking current sources said current bias levels varying inversely with the magnitude of the gain of the audio reproduction system wherein said signal to noise ratio is optimized.

* * * * *